US006456072B1

(12) United States Patent
Webb et al.

(10) Patent No.: US 6,456,072 B1
(45) Date of Patent: Sep. 24, 2002

(54) METHOD AND APPARATUS FOR SIMULTANEOUS ACQUISITION OF HIGH RESOLUTION NMR SPECTRA FROM MULTIPLE SAMPLES

(75) Inventors: Andrew G. Webb, Champaign; Jonathan V. Sweedler, Urbana, both of IL (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 0 days.

(21) Appl. No.: 09/579,827

(22) Filed: May 26, 2000

(51) Int. Cl.[7] ................................................ G01V 3/00
(52) U.S. Cl. ...................... 324/308; 324/307; 324/309; 324/310; 324/312; 324/318; 324/322
(58) Field of Search ................................. 324/308, 321, 324/318, 307, 309, 310, 312, 317, 303, 322, 320

(56) References Cited

U.S. PATENT DOCUMENTS

| | | | | |
|---|---|---|---|---|
| 4,652,827 A | * | 3/1987 | Eguchi et al. ............... | 324/322 |
| 4,654,592 A | * | 3/1987 | Zens .......................... | 324/307 |
| 4,689,563 A | * | 8/1987 | Bottomley et al. .......... | 324/309 |
| 5,574,370 A | * | 11/1996 | Woelk et al. ................ | 324/318 |
| 6,194,900 B1 | * | 2/2001 | Freeman et al. ............. | 324/321 |
| 6,380,737 B1 | * | 4/2002 | Myles ......................... | 324/306 |

OTHER PUBLICATIONS

Oldfield, "A Multiple–Probe Strategy for Ultra–High–Field Nuclear Magnetic Resonance Spectroscopy*," Journal of Magnetic Resonance, Series A, 1994, pp. 107, 255–257, Copyright© 1994 by Academic Press Inc.

Fisher, Petucci, MacNamara and Raftery, "NMR Probe for the Simultaneous Acquisition of Multiple Sample," Journal of Magnetic Resonance, 1999, pp. 138, 160–163, Copyright© 1999 by Academic Press, Inc.

Hammer, "Magnetic field mapping with and array of nuclear magnetic resonance probes," Rev. Sci. Instrum, vol. 67, No. 6, Jun. 1996, ©1996 American Institute of Physics.

MacNamara, Hou, Fisher, Williams and Raftery*, "Multiplex sample NMR: an approach to high–throughput NMR using a parallel coil probe," 1999, pp. 9–16, ©1999 Elsevier Science B.V.

* cited by examiner

*Primary Examiner*—Edward Lefkowitz
*Assistant Examiner*—Dixomara Vargas
(74) *Attorney, Agent, or Firm*—Gary R. Gillen; Wildman, Harrold, Allen & Dixon (57) ABSTRACT

An apparatus for obtaining multiple spectra from a plurality of samples through the use of nuclear magnetic resonance (NMR) spectroscopy. A plurality of microcoils are coupled to and are in operable communication with an NMR spectrometer. The coils are operable in both a transmit mode and a receive mode to transmit RF energy to a sample being analyzed and to receive the return data for analysis by the NMR spectrometer. At least one switch is coupled to the plurality of coils and the NMR spectrometer. A controller for the NMR spectrometer is coupled to the switch and is used to control alternative activation of the coils for NMR data acquisition of multiple samples.

37 Claims, 8 Drawing Sheets

METHOD AND APPARATUS FOR SIMULTANEOUS ACQUISITION OF HIGH RESOLUTION NMR SPECTRA FROM MULTIPLE SAMPLES

FIELD OF THE INVENTION

The present invention relates generally to systems and methods for obtaining spectra from samples through the use of nuclear magnetic resonance (NMR) spectroscopy and, more particularly, to such systems and methods which obtain spectra from multiple samples by employing multiple detectors in a probehead.

BACKGROUND OF THE INVENTION

NMR spectroscopy is one of the most widely used analytical tools in academia and industry to chemically characterize a sample. Typically a single sample is placed into a magnet, a spectrum recorded, the sample ejected and the next sample inserted. Disadvantageously, this conventional approach limits NMR throughput.

The problem of NMR throughput has existed for more than a decade, in particular in the pharmaceutical industry, where the explosive growth of the number of potential drugs synthesized has not been mirrored by increases in the throughput of the methods necessary for analysis and structural determination. This is particularly true for NMR, where robotic sample changing has not significantly changed since its introduction approximately 20 years ago. Various methods have been proposed to increase throughput by using multiple detectors.

The concept of multiple receive coils have been used in magnetic resonance imaging (MRI) where these coils are overlapped to minimize their mutual inductance (and hence correlated noise) in a "phased array" configuration. However, for high resolution NMR spectroscopy the coils cannot be overlapped, and must be decoupled from each other to minimize signal cross-contamination. Oldfield E. *J. Magn.Reson. Ser.A*, 1994, 107, 255–257 demonstrated detection of three nuclei from three different samples in the solid state in one magnet, with spectral line widths of approximately 1 ppm. However, the poor intrinsic spectral resolution using large detectors preclude any useful information from being acquired in the liquid state, which is used in over 99% of combinatorial chemistry analyses.

Another approach seen in Fisher G.; Pettuci C.; MacNamara E.; Raftery D. *J Magn. Reson.* 1999, 138, 160–163 utilizes two coils electrically isolated from one another using a copper ground plane, with the impedance matching networks similarly isolated. Using two independent duplex/preamplifier stages and two receivers, acquisition of two $^{13}C$ spectra was demonstrated. Disadvantageously, this technique essentially requires one spectrometer for each coil. A second technique uses magnetic field gradients to separate signals from different coils. MacNamara E.; Hou T.; Fisher G.; Williams S.; Raftery D.; *Anal.Chem.Acta*, 397, 9 (1999). This technique suffers from loss in sensitivity due to the broadening of resources with results from the application of the gradient, and the need for addition and subtraction of the acquired spectra. This method of coil design and signal separation results in large sensitivity losses in the final spectra, such that minimal, if any, time savings are achieved. Accordingly, there is a need in the art for a method and apparatus that maintains high spectral resolution, and maximum sensitivity while achieving gains in throughput.

SUMMARY OF THE INVENTION

The present invention provides a method and apparatus for simultaneous acquisition of high resolution nuclear magnetic resonance (NMR) spectra from multiple samples. The invention utilizes a combination of high sensitivity coils, and at least one radio frequency switch which are in operable communication with an NMR spectrometer to obtain spectra from multiple samples simultaneously. Significant gains are achieved and spectral quality is maintained. A probehead is provided having multiple coils which operate in transmit and receive mode. In a preferred embodiment, solenoid microcoils are employed which provide high sensitivity, ease of electrical decoupling and efficient use of the homogenous region of the magnet for the NMR spectrometer.

A data acquisition timing scheme is employed which considers the ratio of the recycle delay to the data acquisition time. Data is able to be successively acquired from one sample during the relaxation delay of the other samples. During the relaxation delay of the one sample, data acquisition is performed for another sample. The probe preferably has a microcoil associated with each sample from which spectral data is obtained. Higher efficiency and greater throughput are achieved in the multiple microcoil arrangement through determination of the ratio of the recycle delay between scans, the time required for the pulse sequence, and data acquisition time.

DETAILED DESCRIPTION

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated devices, and such further applications of the principles of the invention as illustrated therein being contemplated as would normally occur to one skilled in the art to which the invention relates.

Figure 1:
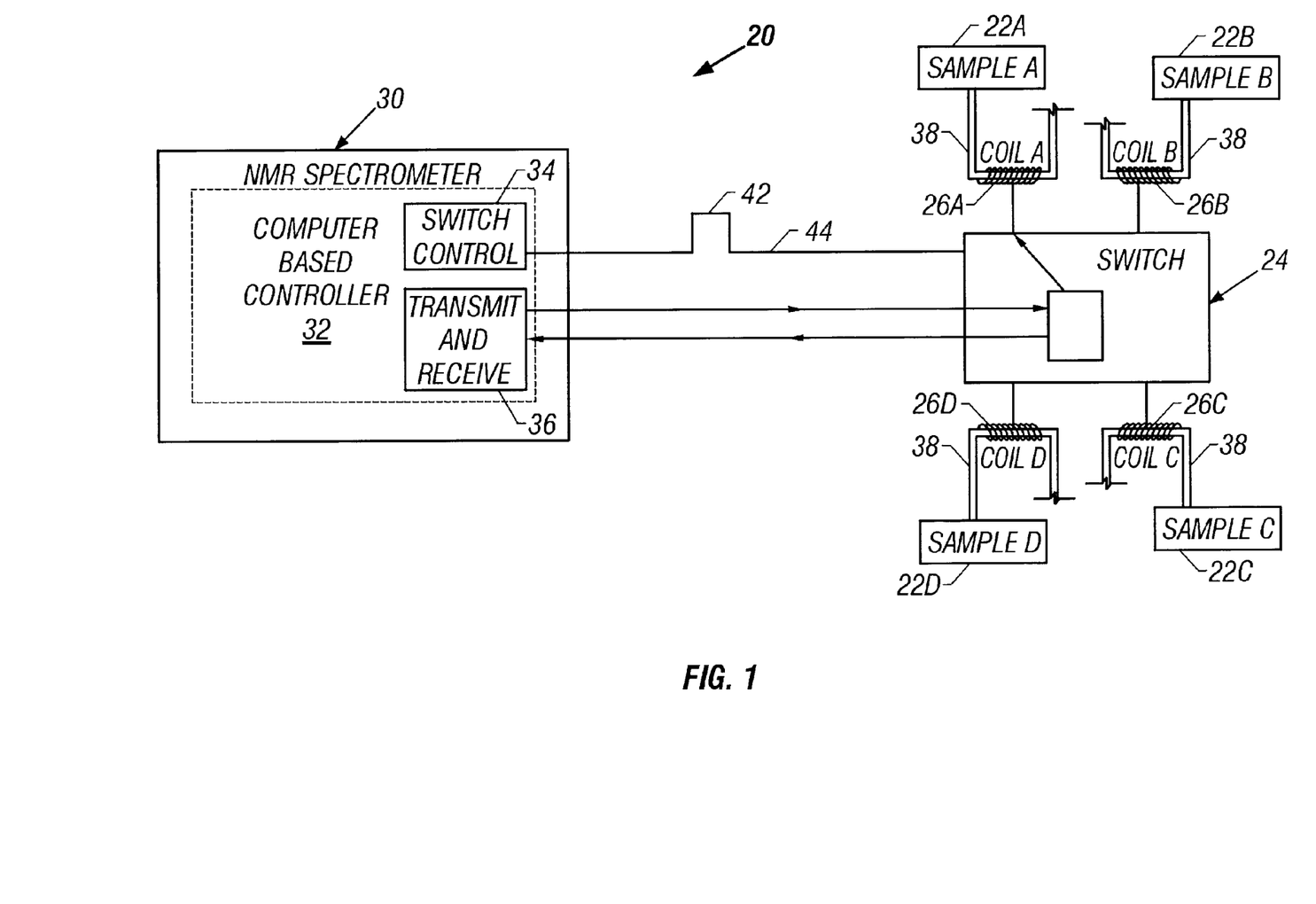
FIG. 1 is a schematic diagram of one embodiment of the invention illustrating an apparatus for obtaining multiple spectra from samples depicting a switch coupled with a first coil.

Referring to FIG. 1, apparatus 20 for obtaining multiple spectra from a plurality of samples 22A–D by employment of nuclear magnetic resonance (NMR) spectroscopy is shown. Switch 24 is shown coupled with coils 26A–D and with NMR spectrometer 30. The coils 26A–D are coupled to and are in operable communication with NMR spectrometer 30 through switch 24. The NMR spectrometer 30 has a computer based controller 32 with switch control 34 to control the timing of switch 24 to alternate switched engagement with each of the coils 26A–D coupled with the switch. Controller 32 also controls transmit and receive circuitry 36 of the NMR spectrometer 30. Transmit and receive signal processing circuitry 36 is operably coupled to the detection coils 26A–D through switch 24 in order to transmit an excitation signal and to receive a free induction decay (FID) signal for analysis of the samples 22A–D at each of the coils. The transmit and receive circuitry 36 is preferably under the control of controller 32 through appropriate A/D and D/A interfaces. The controller 32 of spectrometer 30 is coupled with switch 24 to alternate activation of the coils 26 in succession in order to perform NMR data acquisition of the multiple samples 22A–D.

Figure 2:
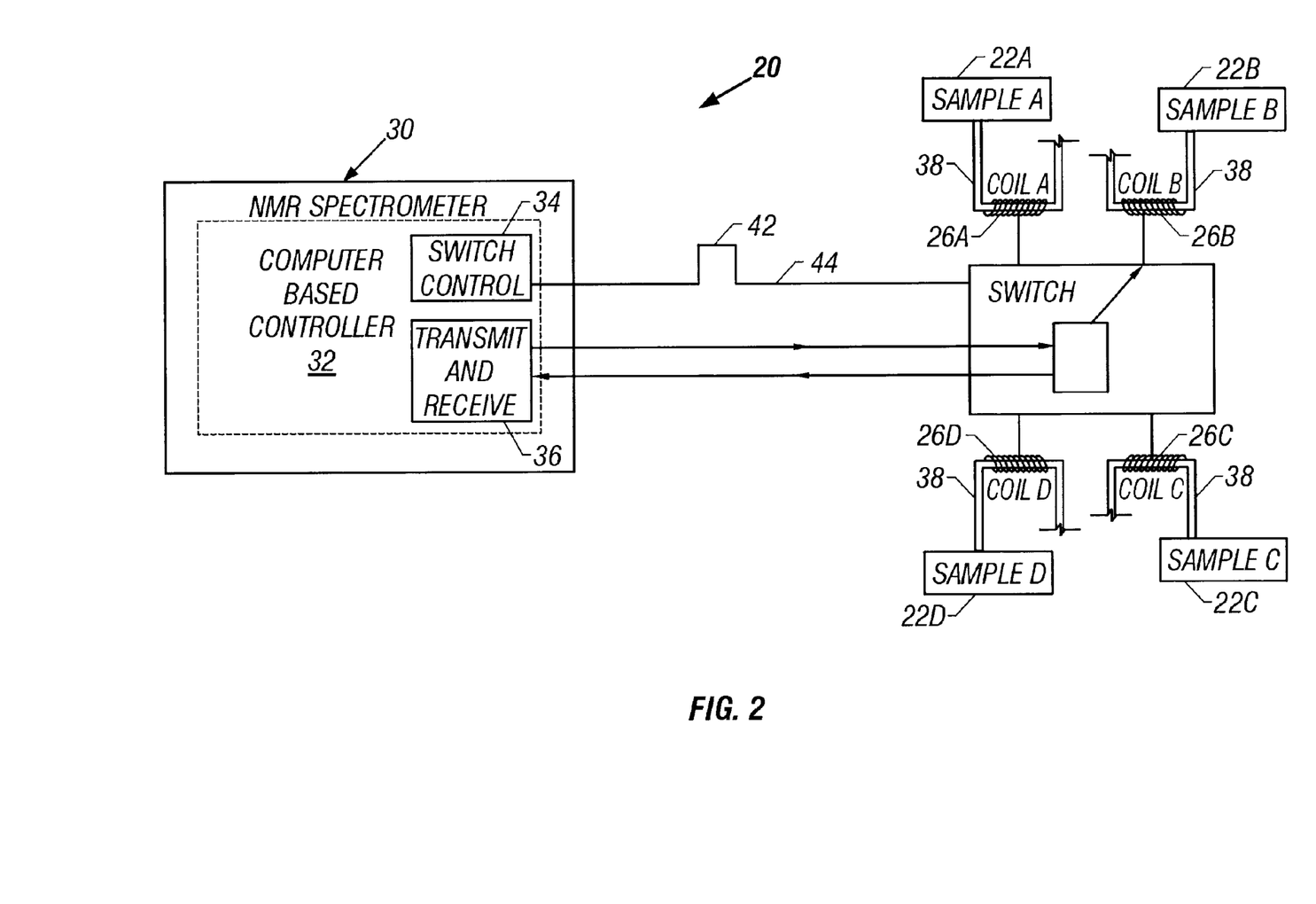
FIG. 2 is a schematic diagram of the apparatus of FIG. 1 illustrating the switch coupled with a second coil.

As seen in FIGS. 1 and 2, each of the individual coils 26A–D is respectively associated with one of the multiple samples 22A–D for analysis by the NMR spectrometer 30. The samples being analyzed are preferably liquid samples, however samples in a solid, solid/liquid state, or gas state may selectively be employed. FIGS. 1 and 2 illustrate a capillary member 38 in proximity with the coils 26 to contain the samples associated with the respective coils for detection of the samples during capillary electrophoresis (CE). The CE application generally illustrated in FIGS. 1 and 2 illustrates only one of many possible applications (including both static NMR detection and NMR detection in other flowing and separation techniques, e.g. liquid chromatography (LC) high-performance liquid chromatography (HPLP) and the like) and forms no part of the present invention. In such various distinct applications, the external apparatii (e.g. buffer solutions, separation instrumentation) may selectively differ.

The controller 32 controls the switch 24 to activate one coil at a time such that when one coil 26A, FIG. 1, is activated each of the other coils 26B, 26C, 26D are inactive. As will be further described with reference to FIG. 3, activation of a coil 26A occurs during the pulse sequence and data acquisition period of the recycle delay for analysis of the sample 22A in communication with the activated coil 26A. During the relaxation delay period for the one coil 26A at least one other coil 26B, 26C or 26D is activated. Preferably, each of the other coils 26B, 26C, 26D are activated in succession by being switched into electrical communication with the switch 24 during the relaxation delay period for the one coil 26A. The other coils 26B, 26C, 26D, FIG. 1, are inactive by not being in switched communication with the switch 24 during the pulse sequence and data acquisition period for the one coil 26A. During coil activation the activated coil is in switched communication with the spectrometer and is enabled to transmit an excitation signal, initiated by the spectrometer, to the sample and to receive the FID signal from the sample for return to the spectrometer. The spectrometer 30 then analyzes the received FID signal for identification of the sample.

The coils 26A–D of the present invention are operable in both the transmit mode and receive mode. Thus, the individual coils both transmit an excitation signal in the form of RF energy to the sample and receive the return FID signal upon excitation of the sample for analysis by the spectrometer. Each of the coils 26A–D are preferably radio frequency (RF) microcoils which are multi-turn solenoidal coils. The preferred multi-turn solenoid microcoils 26A–D may selectively be wound directly onto their corresponding capillary members 38. Various geometric and winding configurations of the microcoils 26A–D may be employed including, but not limited to, saddle coils, surface coils, birdcage coils and coil arrays however, it is desirable to achieve a desirable signal to noise ratio, reduced susceptibility of distortion of the static magnetic field and enhanced spectral resolution. For instance the RF microcoils 26A–D may selectively be wrapped about the exterior surface of the capillary members 38 to a length less than 1 mm to enhance sensitivity and improve signal-to-noise ratio for the NMR spectrometer 30. As will be understood by those with skill in the art, the RF microcoils each preferably have impedance matching electrical elements. For further details on the solenoid RF microcoils and their interaction in a capillary electrophoresis application, reference can be made to: U.S. Pat. No. 5,654, 636, issued Aug. 5, 1997 to Sweedler et al.; and U.S. Pat. No. 5,684,401, issued Nov. 4, 1997 to Peck et al. which are assigned to the assignee of the present invention and which are hereby incorporated by reference.

As seen in the embodiment of FIG. 1, the switch control software 34 of spectrometer controller 32 sends out a pulse 42 along spectrometer control line 44 to direct the switch 24 to select a particular coil (e.g. coil 26A). At this time, the switch 24 is electrically coupled with microcoil 26A and microcoil 26A is in operable communication with the spectrometer 30. The transmit and receive circuitry 36 coupled with switch 24 both initiate the excitation signal at microcoil 26A and receives the FID information from microcoil 26A as described above. The spectrometer 30 analyzes the information received in response to the excitation of sample 22A. When the switch 24 is switched into communication with microcoil 26A, the other microcoils 26B, 26C, 26D are inactive thereby activating one microcoil at a time. After the pulse sequence and data acquisition period for microcoil 26A, a relaxation delay period for microcoil 26A begins. Upon initiation of the relaxation delay for microcoil 26A (and sample 22A), the control line 44 switches to microcoil 26B, FIG. 2. When coil 26B is activated, as seen in FIG. 2, the other microcoils 26A, 26C, 26D are inactive. A pulse sequence and data acquisition period is initiated for microcoil 26B and the spectrometer 30 both sends an excitation signal for transmission to sample 22B by microcoil 26B and the FID information is received by microcoil 26B and returned to the spectrometer for NMR analysis of sample 22B. This process is repeated in succession with microcoils 26C and 26D for data acquisition from samples 22C and 22D. At the completion of the recycle delay period, the controller 22 enables the switch 24 to return to microcoil 26A to repeat the NMR data acquisition process.

Figure 3:
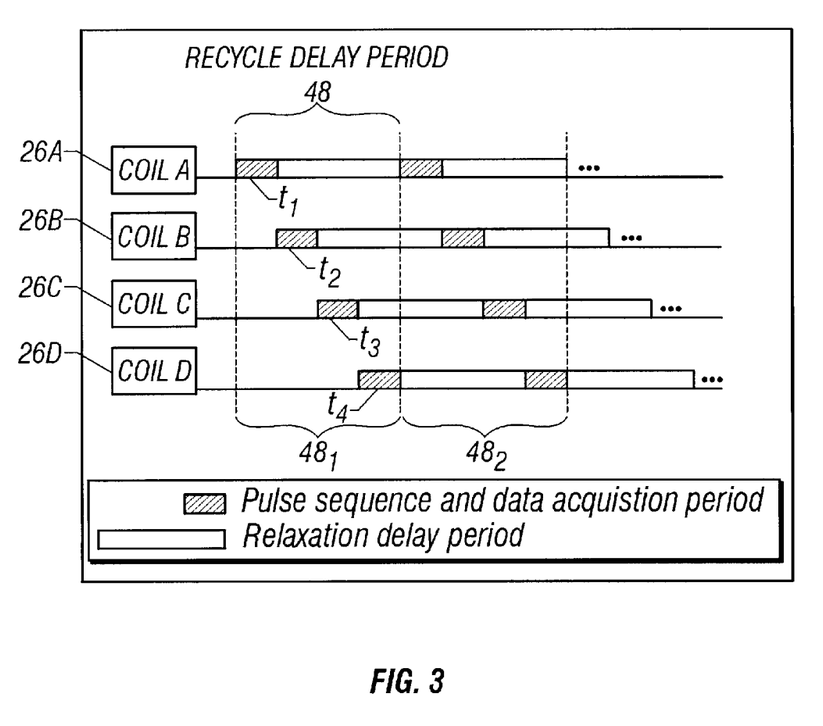
FIG. 3 is a timing diagram which illustrates the activation of multiple coils for nuclear magnetic resonance (NMR) data acquisition of multiple sample during a recycle delay period.

Referring now to FIG. 3, a timing diagram illustrating the activation of multiple coils for NMR data acquisition of multiple samples is shown. The timing diagram of FIG. 3 corresponds to the four-coil embodiment illustrated in FIGS. 1 and 2, and illustrates that the efficiency of a multi-coil apparatus relates to the ratio of the recycle delay between scans by the spectrometer and the time required for the pulse sequence and data acquisition which may selectively be chosen by the user. As seen in the timing scheme of FIG. 3, the recycle delay period 48 is divided into four pulse sequence and data acquisition periods for the four microcoils 26A–D. In the first recycle delay period $48_1$, microcoil 26A is activated at pulse sequence and data acquisition period $t_1$ and each of the other microcoils 26B, 26C, 26D are inactive during the activation of coil 26A.

At the pulse sequence and data acquisition period $t_2$, coil 26B is activated which is during the relaxation delay period for coil 26A, as well as coil 26C and coil 26D. The switch 24 is actively coupled with coil 26B at time period $t_2$ and the spectrometer 30 sends an excitation signal to coil 26B which receives and returns the FID data obtained for analysis of sample 22B. At pulse sequence and data acquisition period $t_3$ for recycle delay period $48_1$, coil 26C is activated for NMR data acquisition of sample 22C. The switch control application 34 at the spectrometer 30 directs switch 24 to switch coil 26C into circuit with the spectrometer 30 whereby the transmit and receive circuitry 36 operates to send an excitation signal to coil 26C and receive the return FID data associated with sample 22C.

The process continues at pulse sequence and data acquisition period $t_4$, in which the controller 32 moves the switch 24 into electrical engagement with coil 26D. RF energy is transmitted to sample 22D through coil 26D and the responsive FID data is received by coil 26D and returned to the spectrometer 30 for NMR analysis of sample 30D. As seen in FIG. 3, at the end of the first recycle delay period $48_1$, and at the beginning of the next recycle delay period $48_2$, the switch control application 34 of the spectrometer 30 directs the switch 24 to return to coil 26A and the data acquisition process for the multiple coils is repeated. To increase throughput and efficiency by utilizing the multi-coil apparatus 20, the sampling rate for the individual coils is increased relative to that for a single coil by a factor equal to or greater than the number of coils. The switch control 34 in conjunction with the transmit and receive circuitry 36 of the spectrometer controller 32 provide activation of the multiple coils 26A–D in a sequential manner to permit complete sampling of data for the samples received by their respectively associated coils using the multi-coil technique of the present invention, significant gains in throughput are achieved while high spectral resolution and maximum sensitivity are maintained. Potential gains in effective throughput obtained through the multi-coil scheme herein described with reference to FIGS. 1–3, can be calculated by considering the ratio of the recycle delay to the pulse sequence and data acquisition time.

Figure 4:
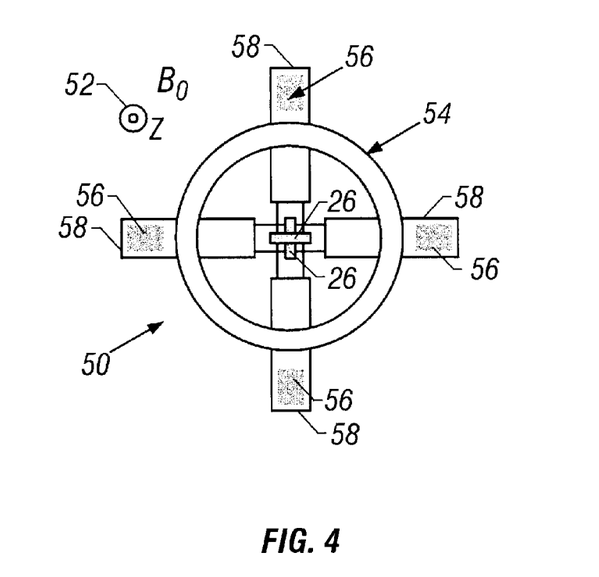
FIG. 4 is a top view schematic of a probe employing multiple coils.
Figure 5:
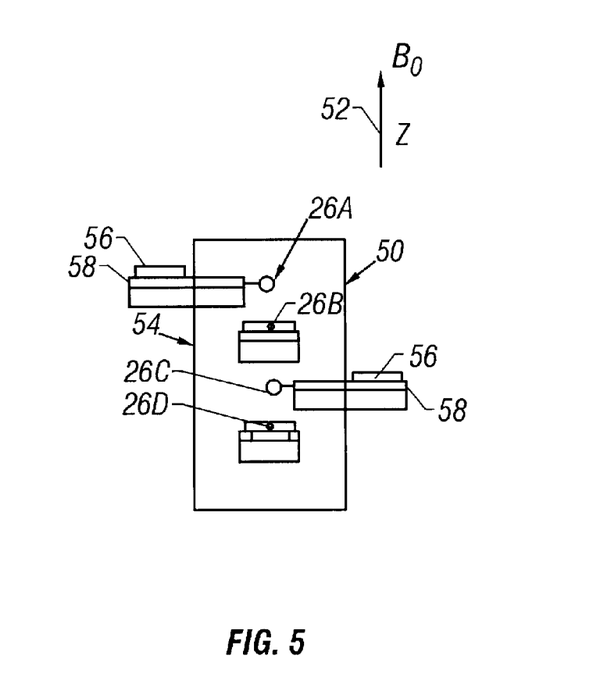
FIG. 5 is a side view schematic of the probe of FIG. 4 having multiple coils.
Figure 6A:
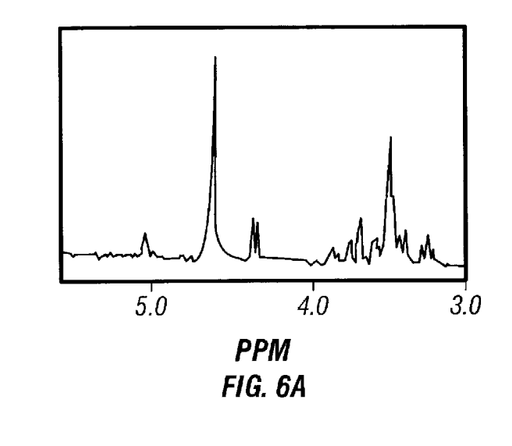
FIGS. 6A–6D are graphs of one-dimensional NMR spectra of various samples obtained using one embodiment of the present invention.
Figure 6B:
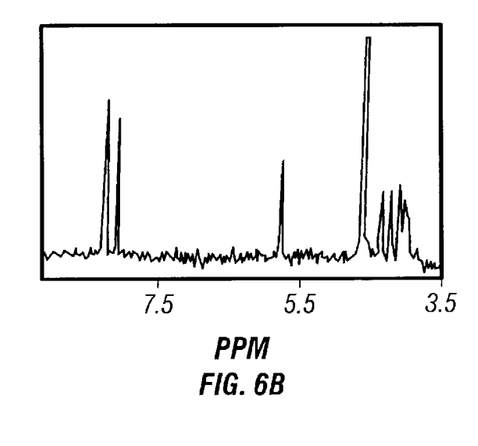
Figure 6C:
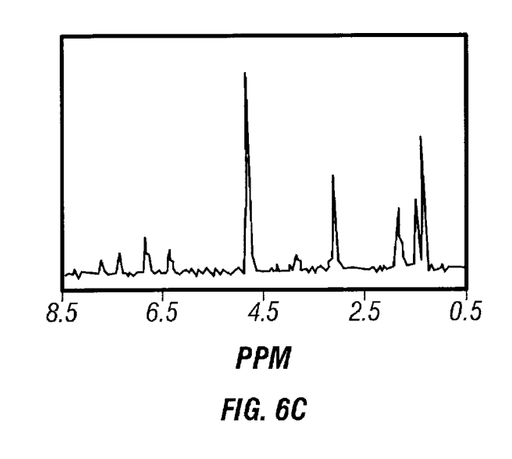
Figure 6D:
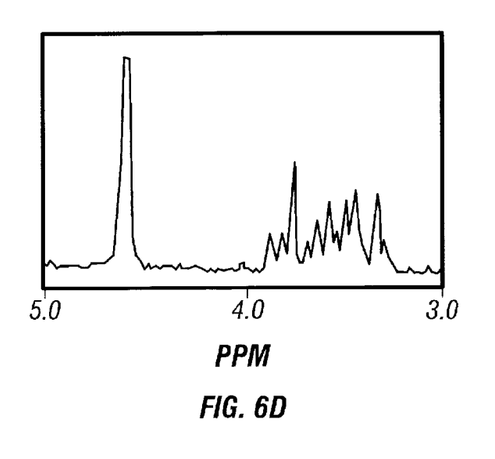
Figure 7A:
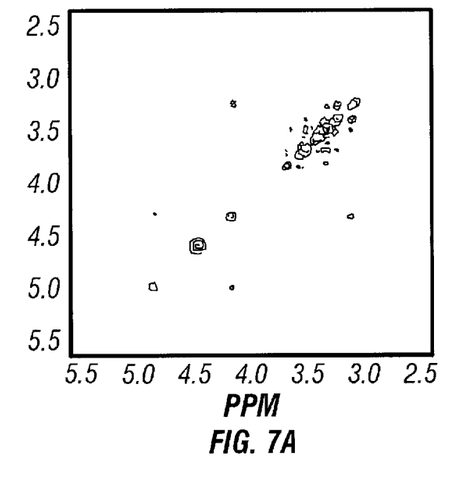
FIGS. 7A–7D are graphs of correlation spectroscopy (COSY) spectra of various samples acquired using a four-coil probe.
Figure 7B:
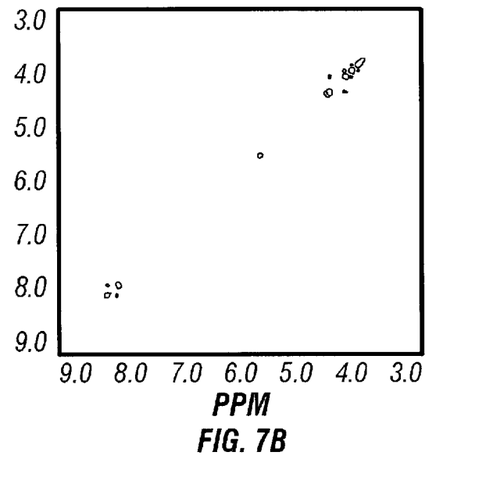
Figure 7C:
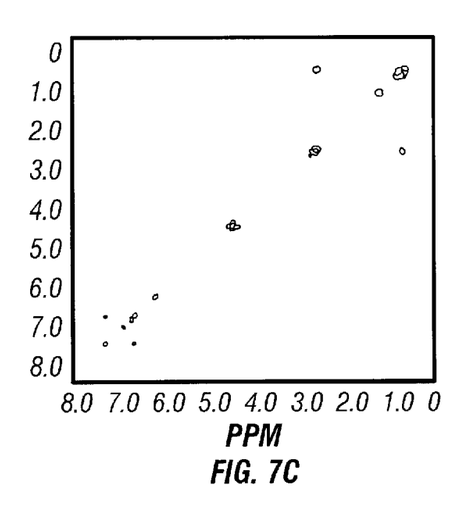
Figure 7D:
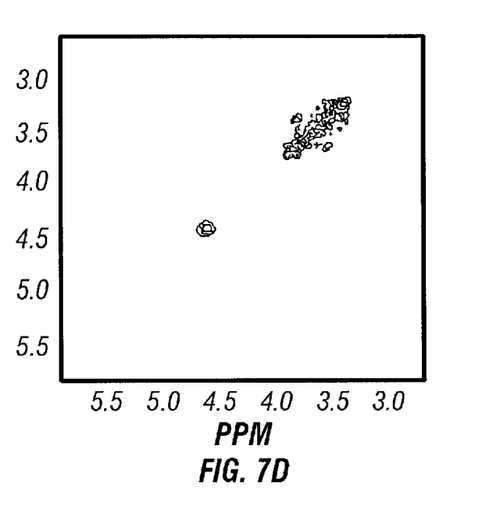

Referring to FIGS. 4 and 5, a multi-coil NMR probe 50 is shown. The probe 50 is positioned within the magnet (not shown) of the NMR spectrometer for operable communication with the $B_0$ magnetic field 52 and the NMR spectrometer. As will be understood by those in the art, a static magnetic field generator (e.g. permanent magnet, superconducting magnet, electromagnet, etc.) is used to establish the $B_0$ magnetic field. The RF microcoils 26A–D are positioned within the NMR probe 50 with each of the microcoils placed around or near their corresponding sample. As seen in FIGS. 4 and 5, each of the RF microcoils 26A–D (and capillaries containing the associated samples) are positioned within the NMR probe 50 substantially perpendicular to the $B_0$ magnetic field 52 established by the magnet of the NMR spectrometer. The probehead 50 is selectively constructed of a polyvinyl chloride (PVC) tube 54 which supports each of the plurality of RF microcoils 26A–D.

The RF microcoils 26A–D each have an associated matching network 56 of impedance matching elements (e.g. capacitors) mounted on a copper base 58. As will be understood by those in the art, the impedance matching elements which match a microcoil impedance to an external coaxial cable (not shown) generally have a non-zero value of susceptibility and can lead to live broadening of the NMR spectrum thus, the impedance matching elements are preferably placed at an opposite end of the coaxial cable. As best seen in FIG. 5, the RF microcoils 26A–D are vertically mounted and spaced apart relative to each other along the length of the probe 50. In the four-coil embodiment of FIGS. 1–5, each microcoil 26A–D is oriented at approximately 90° with respect to adjacent coils about the circumference of the probe 50 in order to minimize coupling. For embodiments employing different numbers of coils, alternate ones of the RF microcoils are preferably positioned at approximately 360/n degrees relative to each other about the probe 50, where n=the number of microcoils employed. Isolation of 30 dB or less between the microcoils is preferable.

Experiment Discussion and Results

Chemicals: Fructose, galactose, adenosine triphosphate and chloroquine, were all purchased from Adrich Chemicals (Milwaukee, Wis.). $D_2O$ (D, 99.9%) was obtained from Cambridge Isotope Laboratories (Andover, Mass.). All chemicals were used without further purification. Fluorinert FC-43 (3M Corp., St. Paul, Minn.), a nonconducting liquid, is a mixture of perfluorinated $C_{12}$ branched tributylamines with an average molecular weight of 670. The volume magnetic susceptibility ($X_v$) of FC-43 is within 15% of that of copper.

Coil construction: Solenoidal RF microcoils were fabricated, and testing using the four-coil apparatus and method as previously described was performed. The four-coil apparatus was constructed for operation in a 250 MHz wide-bore (89 mm) magnet. In the apparatus having the four-coil probehead, each coil was fabricated identically using 17 turns of 50 um diameter copper wire with a 6 um thick polyurethane coating (California Fine Wire Co., Grover Beach, Calif.) wrapped around a 355 um outer diameter (o.d.), 180 um inner diameter (i.e.) polyimide coated fused silica capillary (Polymicro Technologies, Phoenix, Ariz.), giving an observe volume ($V_{obs}$) of 28 nL. Teflon flow-tubes were attached to both ends of the capillary for sample loading. The coils were mounted on printed circuit boards and impedance matching capacitors were added in a balanced configuration. For each individual circuit, the "matching capacitors" were a 2.2 pF fixed capacitor (700 A series, American Technical Ceramics Corp., Huntingdon Station, NY) and a variable capacitor (Gigatrim, 0.6–4.5 pF, Johanson Mfg. Co., Boonton, N.J.). The "tuning" capacitor was a single variable capacitor. The RF microcoils were mounted one above the other with a vertical spacing of 5 mm between adjacent coils. Alternate coils were rotated 90 degrees with respect to each other to reduce coupling. The matching networks were also placed at 90 degrees to each other, to reduce coupling. The whole system was surrounded by a container filled with FC-43. The outer diameter of the assembly was 4.5 cm.

NMR spectroscopy: Experiments were carried out at 250 MHz on a wide-bore (89 mm) magnet (Oxford Instruments, Oxford, England) using a Macintosh controlled Libra console (Tecmag, Houston Tex.) running MacNMR 5.6

Results and Discussion

Inter-coil coupling: Interactions between different coils in the multiple microcoil probes were measured both electrically (HP 8751A network analyzer, Hewlett-Packard, Palo Alto, Calif.) and by NMR. $S_{21}$ parameters effectively measure the ratio of the output voltage across one coil when an input voltage is applied to a second coil; ideally, the value should be zero dB. All the microcoils gave values less than −30 db, indicting excellent isolation. In order to measure the NMR inter-coil signal bleedthrough, coil A was filled with ethanol while coils B, C and D remained empty. A single scan was acquired transmitting through, and receiving from, coil A and the signal-to-noise ratio (S/N) of the central line of the methyl triplet measured. The switch was then configured to transmit through, and receive from, coil B. 128 scans were acquired with a long relaxation delay and the S/N measured as before. This large number of scans were performed to calculate an accurate figure for the cross-talk between the coils. This figure was calculated by dividing the two values of the S/N and scaling by the square root of 128 in order to account for the different number of scans acquired. The results indicate a very small degree of cross-talk between individual coils, in agreement with electrical measurements.

NMR Results

The four-coils tested at 250 MHz were initially filed with a 10% $H_2O$/90% $D_2O$ mixture for shimming. The signal used for shimming consisted of a composite of the four individual free induction decays (FIDs) concatenated together. A simplex routine was used for optimization of the shim currents. The time for shimming was generally less than 30 minutes. The line widths for the four-coils were very similar, lying between 2 and 4 Hertz. An initial experiment was performed to compare the S/N of the spectra acquired with the switch in place, and spectra acquired from a single coil with the conventional receiver chain. Using a single-pole-four-throw switch with integrated TTL drivers the S/N was reduced by approximately 50%, as expected from the noise calculations.

Referring now to FIGS. 6A–6D, one-dimensional spectra were obtained from four solutions of 250 mM fructose (FIG. 6A), chloroquine (FIG. 6B), adenosine triphosphate (FIG. 6C) and galactose (FIG. 6D), all in $D_2O$; 7 mnol of each sample was in the observe volume of the coil. The spectra width and transmitter frequency were optimized for each acquisition (using an Applescript macro for the Tecmag Libra system), with spectral widths of 600, 1400, 2000 and 500 Hz for galactose (FIG. 6D), adenosine triphosphate (FIG. 6C), chloroquine (FIG. 6B) and fructose (FIG. 6A) respectively. The 90 degree pulse widths increased from 1.7 microseconds (20 dB attenuation, 50 Watt amplifier) to 2.1 microseconds upon insertion of the switch. Each sample (250 mM in $D_2O$) was loaded into the coil via attached Teflon tubes. 32 scans were acquired for each spectrum, with no delay between excitations of successive coils. Concurrent with the switch position being incremented, the spectral width was altered to match the frequency spread of the resonance for each compound. 1 Hz line-broadening was applied before Fourier transformation and baseline correction. Spectral widths were 600 Hz (galactose), 1400 Hz (adenosine triphosphate), 2000 Hz (chloroquine) and 500 Hz (fructose). 2048 complex data points were acquired for each spectrum, giving data acquisition times of approximately 1.7, 0.7, 0.5 and 2.0 seconds respectively. The delay between successive 90 degree excitations was 4.9 seconds for each sample.

Standard correlation spectroscopy (COSY) experiments were run on the four samples described previously and the results are displayed in FIGS. 7A–7D. Type COSY spectra were acquired with the four-coil probe. Compounds and concentrations were the same as described above with reference to FIGS. 6A–D for the one-dimensional spectra. Data acquisition parameters: spectral width 2000 Hz, data matrix 512×128 (complex), 16 signal averages, delay between successive coil excitations 400 ms, effective recycle delay for each sample approximately 1.7 s. Data were processed using shifted sine-bell multiplication in both dimensions and displayed in magnitude mode. Since the acquisition time was approximately an order of magnitude less than the recycle delay, a full factor of four improvement in throughput was achieved. No signal bleedthrough was observed from one spectrum to another. Using solenoidal microcoils, multi-dimensional high resolution NMR spectra can be acquired from multiple samples in the same time that it takes to acquire a single spectrum. This scheme combines the intrinsic high sensitivity of microcoils with the high throughput desired for sample screening.

Figure 8:
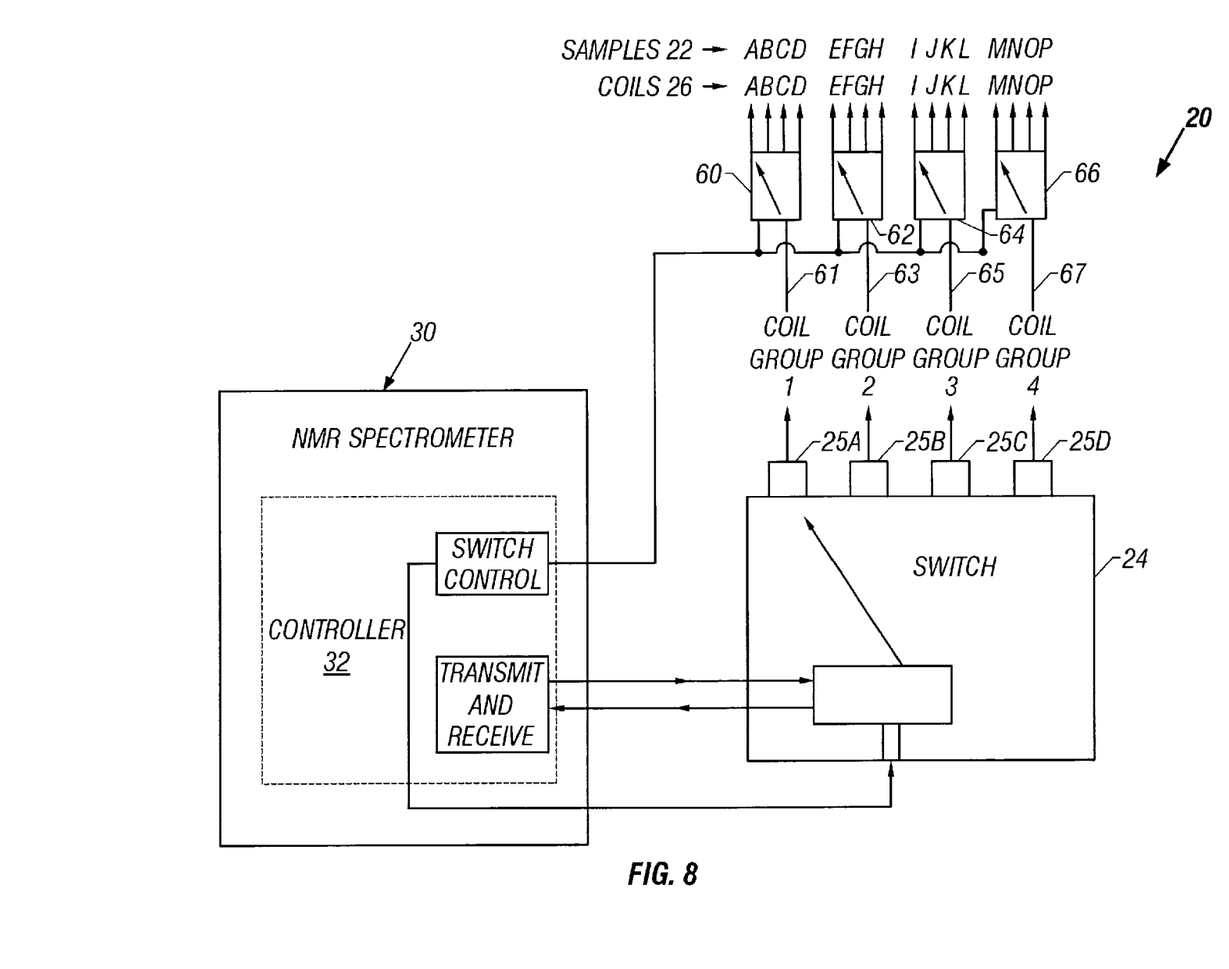
FIG. 8 is a schematic illustrating another embodiment of the invention utilizing high-speed switches coupled with a first switch to increase the number of multiple samples which can be analyzed.

Referring now to FIG. 8, another embodiment of the invention is shown which utilizes time-domain multiplexing through high-speed switches 60, 62, 64, 66 which are coupled to microcoils 26A–P and which are coupled to corresponding outputs switch 24. In this embodiment, the high-speed switches 60, 62, 64, 66 are each coupled to an associated output of the first switch or slow switch 24 to increase the number of samples 22A–P which can be investigated. Switch 24, coupled with spectrometer 30, interacts with the controller 32 as described with reference to FIGS. 1–3, in which switch control 34 is programmed to direct the switch 24 to switch between outputs 25A–D. Switch 24 is a slow switch in that it switches at a slower rate relative to the high-speed switches 60, 62, 64, 66. The transmit and receive circuitry 36 of the spectrometer 30 interacts with switch 24 to send an excite signal to individual ones of the microcoils via high speed switches 60, 62, 64, 66 and to receive FID data from each of the excited samples 22 through the high-speed switches coupled with switch 24. The high-speed switches 60, 62, 64, 66 use the technique of time-domain multiplexing which is further described in FIG. 9.

The embodiment of FIG. 8, illustrates only a single slow switch 24, however it is understood that multiple slow switches 24 may selectively be employed with each one having a plurality of high-speed switches coupled to their respective output ports to further increase the number of samples which can be analyzed. As seen in FIG. 8, the switch control software 34 is coupled to each high-speed switch 60, 62, 64, 66 and switch 24 to independently control each of the switches of the multi-coil MNR data acquisition apparatus 20. Types of switches which may selectively be employed as high-speed switches include those which require less than 100 nanoseconds (ns) to switch, and have relatively low noise figures to maintain a high signal-to-noise ratio.

In the embodiment of FIG. 8, a plurality of coil groups (coil group 1, 2, 3 and 4) are illustrated in which separate ones of the coil groups are coupled through a high-speed switch to an associated output of the first slow switch 24. The separate coil groups each have multiple coils. Separate coils in the coil groups are selectively activated by nested switches. In the nested switch arrangement the high-speed switches 60, 62, 64, 66 are coupled to or are within the slow switch 24 such that the slow switch 24 (or switches) setting selects one or more high-speed switches. Additionally, individual ones of the high-speed switches 60, 62, 64, 66 are respectively associated with a coil group and are coupled with each of the coils of its associated coil group. For instance, coils 26A–D of coil group 1 are each coupled with high-speed switch 60, coils 26E–H of coil group 2 are coupled with high speed switch 62, coils 261–L of coil group 3 are coupled with high-speed switch 64, and coils 26M–P of coil group 4 are coupled with high-speed switch 66. In similar fashion to the slow-switch mode embodiment described in FIGS. 1–3, in this fast-switch mode embodiment of FIGS. 8 and 9 each of the microcoils 26A–P are respectively associated with one of the samples 22A–P for analysis by NMR spectroscopy. Each of the coils in this embodiment also are preferably radio frequency (RF) microcoils and may selectively be multi-turn solenoidal RF microcoils to achieve high spectral resolution and maximum sensitivity.

As illustrated in FIG. 8, inputs 61, 63, 65, 67 for each of the individual ones of the high-speed switches 60, 62, 64, 66 is coupled with an associated output 25A–D of the first slow switch 24. The outputs of the high speed switches are coupled with the coils of the coil group associated with the individual high speed switches in which the coils are each associated with individual samples. In the time-domain multiplexing approach of FIG. 8, the switch control software 34 at controller 32 controls the first switch 24 to successively switch between high-speed switches 60, 62, 64, 66 coupled with outputs 25A–D of switch 24. The switch control 34 of the NMR spectrometer controller 32 also controls the individual ones of the high-speed switches 60, 62, 64, 66 to activate one microcoil at a time. When one microcoil 26A is activated, for NMR data acquisition of its associated sample 22A, each of the other microcoils 26B, 26C, 26D of the coil group (group 1) are inactive. The other coils for the other coil groups (coils 26E–H for group 2; coils 26I–L for group 3; and coils 26M–P for group 4) are also inactive when switch 24 is switched into communication with high-speed switch 60 having coil group 1. When slow switch 24 is in communication with one high-speed switch 60, the switch control 34 directs high-speed switch 60 to switch between coils 26A–D at fast rates for high-speed data acquisition at the multiple samples 26A–D. For instance, a sampling rate could selectively be increased from 5 KHz to 20 KHz for four coils operating at 500 MHz. This fast mode approach using timedomain multiplexing continues as switch 24 alternates between the other high-speed switches 62, 64, 66.

Figure 9:
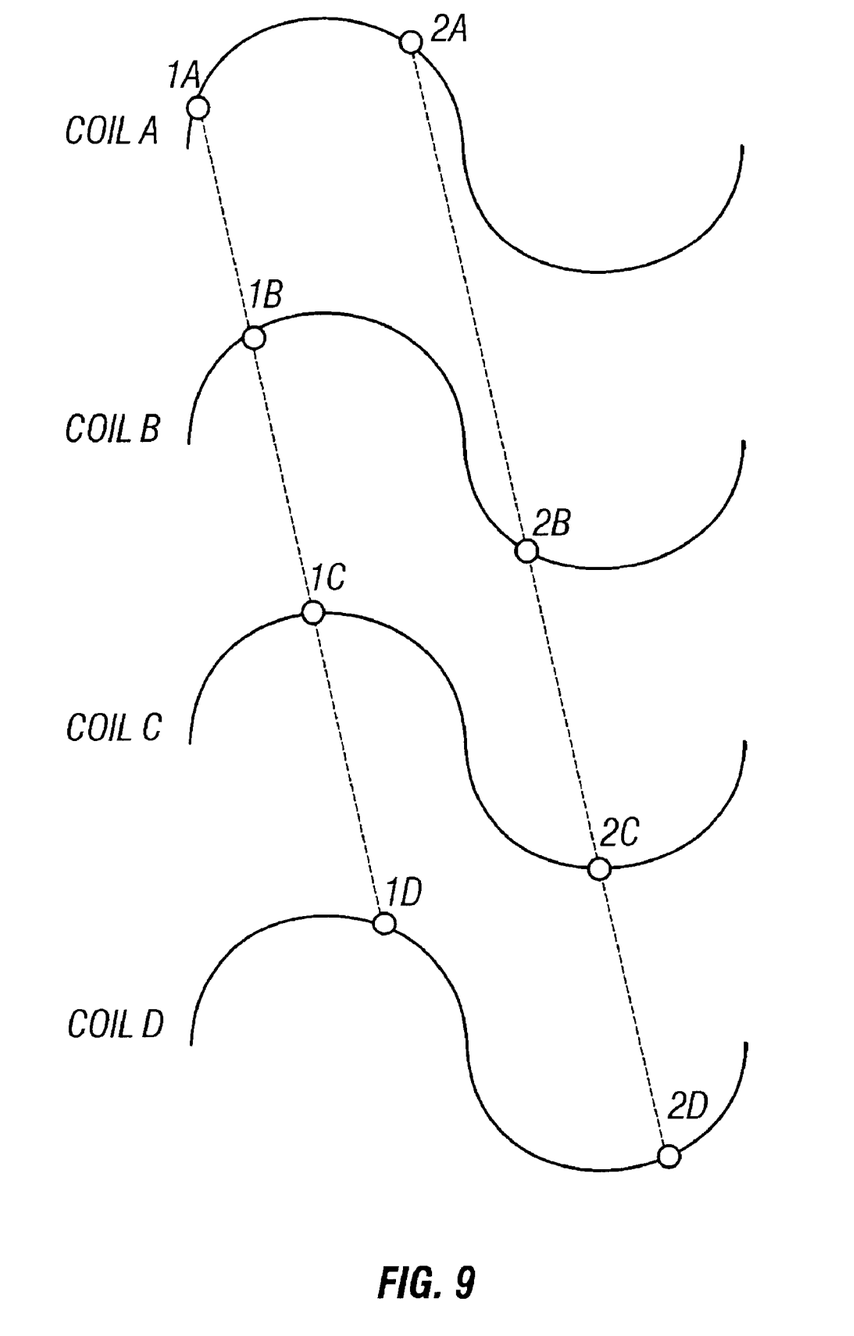
FIG. 9 is a schematic diagram illustrating the time-domain multiplexing scheme employed in the embodiment of FIG. 8.

Referring now to FIG. 9, a schematic diagram illustrating the time-domain multiplexing scheme used at the high-speed switches 60, 62, 64, 66 is shown. FIG. 9 is illustrative of a small portion of the NMR signal with four coils 26A–D and two-data points (1 and 2) for each coil. Each signal from each coil 26A–D is sampled at an appropriate frequency to permit the digitizer at the spectrometer 30 to acquire the data at four times the standard rate. Sampling at frequency rates is to be increased such that data acquisition is increased by a factor equal to the number of coils coupled with the high speed switch. After data acquisition, the multiplexed data is separated into individual data sets for analysis at the spectrometer.

In accordance with the present invention, a method for obtaining multiple spectra from multiple samples through nuclear magnetic resonance (NMR) spectroscopy is provided having the steps of: coupling a plurality of coils which are operable in a transmit mode and a receive mode to an NMR spectrometer for operable communication between the coils and the NMR spectrometer; coupling at least one switch with the coils and the NMR spectrometer; and controlling the at least one switch to alternate activation of the coils for NMR data acquisition of multiple samples. One of the coils is activated during a pulse sequence and data acquisition period for analyzing one of the samples. The steps of activating another coil during a relaxation delay period for the one coil, and deactivating the other coil during activation at the pulse sequence and data acquisition period for the one coil are also performed.

A controller associated with the NMR spectrometer controls the switch to activate one coil at a time such that when one coil is activated each of the other coils are inactive. Each of the coils are respectively associated with a corresponding sample for analysis by NMR spectroscopy. An NMR probe is in operable communication with the NMR spectrometer, and the solenoidal RF microcoils are positioned within the NMR probe substantially perpendicular to a magnetic field established by the NMR spectrometer. The RF microcoils are vertically spaced at the probe and alternate ones of the RF microcoils are positioned about the probe at approximately 360/n degrees relative to each other where n=the number of microcoils. The method further includes the steps of increasing a sampling rate for individual coils of the plurality of coils, relative to a sampling rate for a single coil, by a factor equal to or greater than the number of coils and activating the coils in a sequential manner to permit complete sampling of data for the samples.

The method alternatively includes the steps of establishing a plurality of coil groups, and activating separate coils of the plurality of coil groups by at least one nested switch. Each of the coils in the coil groups are respectively associated with a single sample for analysis by NMR spectroscopy. The method further includes the steps of: providing a plurality of high-speed switches, with the high-speed switches having an input and a plurality of outputs, associating individual ones of the high-speed switches with a coil group, and coupling the coils of the coil group with the outputs of the associated high-speed switch for the coil group. The input for individual ones of the high-speed switches is preferably coupled with an assigned output of a first slow switch and an input of the slow switch is coupled with the NMR spectrometer. The method further includes the steps of controlling the first slow switch to successively switch between each of the high-speed switches coupled with the outputs of the slow switch, and controlling one of the high-speed switches, when in switched communication with the slow switch, to activate one microcoil at a time of the coil group for the one high-speed switch such that when one microcoil is activated, for NMR data acquisition of a sample associated with the one microcoil, each of the other microcoils of the coil group are inactive.

From the foregoing, it will be observed that numerous modifications and variations can be effected without departing from the true spirit and scope of the novel concept of the present invention. It will be understood that no limitation with respect to the specific embodiment is intended or should be inferred. The disclosure is intended to cover, by the appended claims, all such modifications as fall within the scope of the claims.

What is claimed is:

1. An apparatus for obtaining multiple spectra from a plurality of samples by employment of nuclear magnetic resonance (NMR) spectroscopy, comprising:

a plurality of coils coupled to and in operable communication with an NMR spectrometer, said coils operable in a transmit mode and receive mode, and individual coils of the plurality of coils are respectively associated with separate ones of the plurality of samples;

at least one switch coupled with the plurality of coils and the NMR spectrometer; and a controller of the NMR spectrometer coupled with the at least one switch to alternate activation of the plurality of coils for NMR data acquisition of the separate ones of the plurality of samples such that high resolution NMR spectra are able to be acquired from the separate ones of the plurality of samples.

2. The apparatus of claim 1 in which one of the plurality of coils is activated during a pulse sequence and data acquisition period for analyzing one of the plurality of samples.

3. The apparatus of claim 2 in which another coil of the plurality of coils is activated during a relaxation delay period of the one coil and the other coil is inactive during the one coil's activation at the pulse sequence and data acquisition period.

4. The apparatus of claim 1 in which the controller controls the at least one switch to activate one coil at a time such that when one coil is activated each of the other of the plurality of coils are inactive.

5. The apparatus of claim 4 in which each of the coils is respectively associated with a separate one of the plurality of samples for analysis by NMR spectroscopy such that multi-dimensional high resolution NMR spectra are able to be acquired from the separate ones of the plurality of samples.

6. The apparatus of claim 5 in which the plurality of coils are radio frequency (RF) microcoils.

7. The apparatus of claim 6 in which each of the RF microcoils are multi-turn solenoidal coils which are less than one millimeter in length.

8. The apparatus of claim 7 including an NMR probe in operable communication with the NMR spectrometer in which each of the plurality of RF microcoils are positioned within the NMR probe substantially perpendicular to a magnetic field established by the NMR spectrometer such that isolation is less than −30 dB between the RF microcoils.

9. An apparatus for obtaining multiple spectra from a plurality of samples by employment of nuclear magnetic resonance (NMR) spectroscopy, comprising:

a plurality of coils, said coils are radio frequency (RF) microcoils that are multi-turn solenoidal coils, coupled to and in operable communication with an NMR spectrometer, said coils operable in a transmit mode and receive mode and each of said coils is respectively associated with one of the plurality of samples for analysis by NMR spectroscopy;

at least one switch coupled with the plurality of coils and the NMR spectrometer;

a controller of the NMR spectrometer coupled with the at least one switch to alternate activation of the plurality of coils for NMR data acquisition of multiple samples, the controller controls the at least one switch to activate one coil at a time such that when the one coil is activated each of the other of the plurality of coils are inactive;

an NMR probe in operable communication with the NMR spectrometer in which each of the plurality of RF microcoils are positioned within the NMR probe substantially perpendicular to a magnetic field established by the NMR spectrometer and in which the plurality of RF microcoils are vertically mounted and spaced apart at the probe with alternate ones of the plurality of RF microcoils positioned at approximately 360/n degrees relative to each other about the probe where n=the number of the plurality of microcoils.

10. An apparatus for obtaining multiple spectra from a plurality of samples by employment of nuclear magnetic resonance (NMR) spectroscopy, comprising:

a plurality of coils coupled to and in operable communication with an NMR spectrometer, said coils operable in a transmit mode and receive mode and arranged such that the isolation between the coils is less than −30 dB;

at least one switch coupled with the plurality of coils and the NMR spectrometer; and a controller of the NMR spectrometer coupled with the at least one switch to alternate activation of the plurality of coils for NMR data acquisition of multiple samples and in which a sampling rate for individual coils of the plurality of coils is increased relative to a single coil by a factor equal to or greater than the number of coils.

11. The apparatus of claim 10 including means for activating the plurality of coils in a sequential manner to permit complete sampling of data for the plurality of samples in which said data is received by associated ones of the plurality of coils.

12. An apparatus for obtaining multiple spectra from a plurality of samples by employment of nuclear magnetic resonance (NMR) spectroscopy, comprising:

a plurality of coils coupled to and in operable communication with an NMR spectrometer, said coils operable in a transmit mode and receive mode;

at least one switch coupled with the plurality of coils and the NMR spectrometer;

a controller of the NMR spectrometer coupled with the at least one switch to alternate activation of the plurality of coils for NMR data acquisition of multiple samples such that high resolution NMR spectra are able to be acquired from the separate ones of the plurality of samples; and a plurality of coil groups in which separate coils of the plurality of coil groups are activated by nested switches.

13. The apparatus of claim 1 including a plurality of coil groups in which the coil groups each have multiple coils, each of said coils being respectively associated with one of the plurality of samples for analysis by NMR spectroscopy.

14. An apparatus for obtaining multiple spectra from a plurality of samples by employment of nuclear magnetic resonance (NMR) spectroscopy, comprising:

a plurality of coils coupled to and in operable communication with an NMR spectrometer, said coils operable in a transmit mode and receive mode;

at least one switch coupled with the plurality of coils and the NMR spectrometer;

a controller of the NMR spectrometer coupled with at least one switch to alternate activation of the plurality of coils for NMR data acquisition of multiple samples;

a plurality of coil groups in which the coil groups each have multiple coils, each of said coils being respectively associated with one of the plurality of samples for analysis by NMR spectroscopy such that high resolution NMR spectra are able to be acquired from the separate ones of the plurality of samples; and a plurality of high-speed switches in which individual high speed switches are respectively associated with a coil group and are coupled with each of the coils of its associated coil group.

15. An apparatus for obtaining multiple spectra from a plurality of samples by employment of nuclear magnetic resonance (NMR) spectroscopy, comprising:

a plurality of coils coupled to and in operable communication with an NMR spectrometer, said coils operable in a transmit mode and receive mode, at least one switch coupled with the plurality of coils and the NMR spectrometer;

a controller of the NMR spectrometer coupled with at least one switch to alternate activation of the plurality of coils for NMR data acquisition of multiple samples;

a plurality of coil groups in which the coil groups each have multiple coils, each of said coils being respectively associated with one of the plurality of samples for analysis by NMR spectroscopy; and a plurality of high-speed switches in which individual high speed switches are respectively associated with a coil group and are coupled with each of the coils of its associated coil group and in which an input for each of the individual high-speed switches is coupled with an output of at least one slow switch and in which outputs of the high-speed switches are coupled with the coils associated with individual samples.

16. The apparatus of claim 15 in which the plurality of coils are radio frequency (RF) microcoils.

17. The apparatus of claim 16 in which the (RF) microcoils are multi-turn solenoidal coils.

18. The apparatus of claim 16 in which the controller controls the slow switch to successively switch between high-speed switches coupled with the outputs of the slow switch and in which the controller controls the individual ones of the high-speed switches to activate one microcoil at a time such that when one microcoil is activated, for NMR data acquisition of an associated sample, each of the other microcoils of the coil group are inactive.

19. The apparatus of claim 18 in which the plurality of samples are liquid samples.

20. A method of obtaining multiple spectra from a plurality of samples through nuclear magnetic resonance (NMR) spectroscopy, comprising the steps of:
    coupling a plurality of coils which are operable in a transmit mode and a received mode to an NMR spectrometer for operable communication between the coils and the NMR spectrometer;
    respectively associating individual coils of the plurality of coils with separate ones of the plurality of samples;
    coupling at least one switch with the plurality of coils and the NMR spectrometer; and
    controlling the at least one switch to alternate activation of the plurality of coils for NMR data acquisition of the separate ones of the plurality of samples such that high resolution NMR spectra are able to be acquired from the separate ones of the plurality of samples.

21. The method of claim 20 including the step of activating one of the plurality of coils during a pulse sequence and data acquisition period for analyzing one of the plurality of samples.

22. The method of claim 21 including the step of activating another coil of the plurality of coils during a relaxation delay period for the one coil, and
    deactivating the other coil during activation at the pulse sequence and data acquisition period for the one coil.

23. The method of claim 20 in which the step of controlling includes the step of controlling, by a controller associated with the NMR spectrometer, the at least one switch to activate one coil at a time such that when one coil is activated each of the other of the plurality of coils are inactive.

24. The method of claim 23 including the step of respectively associating each of the plurality of coils with a corresponding sample of the plurality of samples for analysis by NMR spectroscopy such that multi-dimensional high resolution NMR spectra are able to be acquired from the separate ones of the plurality of samples.

25. The method of claim 24, including the step of establishing the plurality of coils as radio frequency (RF) microcoils.

26. The method of claim 25 in which the step of establishing includes the step of establishing each of the RF microcoils as multi-turn solenoidal coils which are less than one millimeter in length.

27. The method of claim 25 including the steps of providing an NMR probe in operable communication with the NMR spectrometer, and
    positioning the plurality of RF microcoils within the NMR probe substantially perpendicular to a magnetic field established by the NMR spectrometer such that isolation is less than −30 dB between the RF microcoils.

28. A method for obtaining multiple spectra from a plurality of samples through nuclear magnetic resonance (NMR) spectroscopy, comprising the steps of:
    coupling a plurality of coils which are operable in a transit mode and a receive mode to an NMR spectrometer for operable communication between the coils and the NMR spectrometer;
    coupling at least one switch with the plurality of coils and the NMR spectrometer;
    controlling the at least one switch to alternate activation of the plurality of coils for NMR data acquisition of multiple samples, a controller associated with the NMR spectrometer is utilized to control the at least one switch to activate one coil at a time such that when one coil is activated each of the other of the plurality of coils are inactive;
    respectively associating each of the plurality of coils with a corresponding sample of the plurality of samples for analysis by NMR spectroscopy;
    establishing the plurality of coils as radio frequency (RF) microcoils;
    providing an NMR probe in operable communication with the NMR spectrometer;
    positioning the plurality of RF microcoils within the NMR probe substantially perpendicular to a magnetic field established by the NMR spectrometer;
    vertically spacing the plurality of RF microcoils at the probe; and
    positioning alternate ones of the plurality of RF microcoils about the probe at approximately 360/n degrees relative to each other where n=the number of the plurality of microcoils.

29. A method for obtaining multiple spectra from a plurality of samples through nuclear magnetic resonance (NMR) spectroscopy, comprising the steps of:
    coupling a plurality of coils which are operable in a transmit mode and a receive mode to an NMR spectrometer for operable communication between the coils and the NMR spectrometer;
    arranging the plurality of coils such that the isolation between the coils is less than −30 dB;
    coupling at least one switch with the plurality of coils and the NMR spectrometer;
    controlling the at least one switch to alternate activation of the plurality coils for NMR data acquisition of multiple samples; and
    increasing a sampling rate for individual coils of the plurality of coils, relative to a sampling rate for a single coil, by a factor equal to or greater than the number of coils.

30. The method of claim 29 including the step of activating the plurality of coils in a sequential manner to permit complete sampling of data for the plurality of samples.

31. A method for obtaining multiple spectra from a plurality of samples through nuclear magnetic resonance (NMR) spectroscopy, comprising the steps of:

coupling a plurality of coils which are operable in a transmit mode and a receive mode to an NMR spectrometer for operable communication between the coils and the NMR spectrometer;

coupling at least one switch with the plurality of coils and the NMR spectrometer; establishing a plurality of coil groups;

activating separate coils of the plurality of coil groups by at least one nested switch; and controlling the at least one switch to alternate activation of the plurality coils for NMR data acquisition of multiple samples such that high resolution of NMR spectra are able to be acquired from the separate ones of the plurality of samples.

32. A method for obtaining multiple spectra from a plurality of samples through nuclear magnetic resonance (NMR) spectroscopy, comprising the steps of:

coupling a plurality of coils which are operable in a transmit mode and a receive mode to an NMR spectrometer for operable communication between the coils and the NMR spectrometer;

coupling at least one switch with the plurality of coils and the NMR spectrometer;

controlling the at least one switch to alternate activation of the plurality coils for NMR data acquisition of multiple samples;

establishing a plurality of coil groups; and respectively associating each of said coils in the plurality of coil groups with a single sample of the plurality of samples for analysis by NMR spectroscopy such that high resolution NMR spectra are able to be acquired from the separate ones of the plurality of samples.

33. The method of claim 32 including the steps of providing a plurality of high-speed switches, said high-speed switches having an input and a plurality of outputs, associating individual high-speed switches with a coil group, and coupling the coils of the coil group with the outputs of the associated high-speed switch for the coil group.

34. A method for obtaining multiple spectra from a plurality of samples through nuclear magnetic resonance (NMR) spectroscopy, comprising the steps of:

coupling a plurality of coils which are operable in a transmit mode and a receive mode to an NMR spectrometer for operable communication between the coils and the NMR spectrometer;

coupling at least one switch with the plurality of coils and the NMR spectrometer;

controlling the at least one switch to alternate activation of the plurality coils for NMR data acquisition of multiple samples;

establishing a plurality of coil groups;

respectively associating each of said coils in the plurality of coil groups with a single sample of the plurality of samples for analysis by NMR spectroscopy;

providing a plurality of high-speed switches, said high-speed switches having an input and a plurality of outputs;

associating individual high-speed switches with a coil group;

coupling the coils of the coil group with the outputs of the associated high-speed switch for the coil group;

coupling the input for individual high-speed switches with an assigned output of at least one slow switch; and coupling an input of the at least one slow switch with the NMR spectrometer.

35. The method of claim 34 including the step of establishing the plurality of coils as radio frequency (RF) microcoils.

36. The method of claim 35 including the step of establishing the RF microcoils as multi-turn solenoidal coils.

37. The method of claim 35 including the step of controlling the at least one slow switch to successively switch between each of the plurality of high-speed switches coupled with the outputs of the at least one slow switch, and controlling one of the high-speed switches, when in switched communication with the slow switch, to activate one microcoil at a time of the coil group for the one high-speed switch such that when one microcoil is activated, for NMR data acquisition of a sample associated with the one microcoil, each of the other microcoils of the coil group are inactive.

* * * * *

UNITED STATES PATENT AND TRADEMARK OFFICE
CERTIFICATE OF CORRECTION

PATENT NO. : 6,456,072 B1
DATED : September 24, 2002
INVENTOR(S) : Webb et al.

It is certified that error appears in the above-identified patent and that said Letters Patent is hereby corrected as shown below:

Column 1,
Line 5, please insert the following acknowledgement of federal sponsorship after the Title of the Invention:

-- This invention was made with Government support under Contract Number PHS 1 RO1 GM53030 awarded by the National Institutes of Health (NIH) and Contract Number DBI 96-05824 awarded by the National Science Foundation (NSF). The Government has certain rights in the invention. --

Signed and Sealed this

Fourth Day of February, 2003

JAMES E. ROGAN
*Director of the United States Patent and Trademark Office*